(12) United States Patent
Bacchi et al.

(10) Patent No.: US 6,357,996 B2
(45) Date of Patent: *Mar. 19, 2002

(54) EDGE GRIPPING SPECIMEN PREALIGNER

(75) Inventors: Paul Bacchi, Novato; Paul S. Filipski, Greenbrae, both of CA (US)

(73) Assignee: Newport Corporation, Irvine, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/312,583

(22) Filed: May 14, 1999

(51) Int. Cl.$^7$ ................................................ B65H 9/08
(52) U.S. Cl. ..................... 414/754; 414/757; 414/777; 414/816
(58) Field of Search ................. 414/754, 757, 414/777, 778, 779, 780, 781, 784, 816

(56) References Cited

U.S. PATENT DOCUMENTS

| | | | |
|---|---|---|---|
| 2,367,991 A | | 1/1945 | Bailey ........................... 294/34 |
| 3,865,254 A | * | 2/1975 | Johannsmeier ........... 214/1 BH |
| 4,024,944 A | | 5/1977 | Adams et al. ............... 198/394 |
| 4,345,836 A | * | 8/1982 | Phillips ........................ 355/53 |
| 4,410,209 A | | 10/1983 | Trapani ......................... 294/34 |
| 4,452,480 A | | 6/1984 | Maier et al. ................. 294/104 |
| 4,483,434 A | * | 11/1984 | Miwa et al. ................. 190/394 |
| 4,639,028 A | | 1/1987 | Olson ........................... 294/34 |
| 4,655,584 A | * | 4/1987 | Tanaka et al. ................ 355/53 |
| 4,662,811 A | | 5/1987 | Hayden ....................... 414/433 |
| 4,685,206 A | * | 8/1987 | Kobayashi et al. ........... 29/740 |
| 4,717,190 A | | 1/1988 | Witherspoon ............... 294/99.2 |
| 4,770,600 A | * | 9/1988 | Ishikawa ..................... 414/783 |
| 4,880,348 A | * | 11/1989 | Baker et al. ................. 414/783 |
| 4,887,904 A | * | 12/1989 | Nakazato et al. ........... 356/375 |
| 4,900,214 A | | 2/1990 | Ben ............................. 414/416 |
| 4,938,600 A | | 7/1990 | Into ............................. 365/401 |
| 4,944,650 A | * | 7/1990 | Matsumoto .................. 414/757 |
| 5,052,886 A | * | 10/1991 | Moroi .......................... 414/816 |
| 5,092,729 A | | 3/1992 | Yamazaki et al. ........... 414/225 |
| 5,193,972 A | * | 3/1993 | Engelbrecht ................. 414/754 |
| 5,238,354 A | | 8/1993 | Volovich ..................... 414/779 |
| 5,332,352 A | | 7/1994 | Poduje et al. ................ 414/225 |
| 5,387,067 A | | 2/1995 | Grunes ........................ 414/217 |
| 5,456,561 A | | 10/1995 | Poduje et al. ................ 414/225 |
| 5,511,934 A | | 4/1996 | Bacchi et al. ............... 414/783 |
| 5,513,948 A | | 5/1996 | Bacchi et al. ............... 414/783 |
| 5,532,771 A | | 7/1996 | Johnson et al. ............. 351/211 |
| 5,538,385 A | | 7/1996 | Bacchi et al. ............... 414/403 |
| 5,697,759 A | | 12/1997 | Bacchi et al. ............... 414/786 |
| 5,875,507 A | * | 3/1999 | Stephens et al. .............. 15/102 |

\* cited by examiner

Primary Examiner—Joseph A. Fischetti
(74) Attorney, Agent, or Firm—Stoel Rives LLP

(57) ABSTRACT

Specimen edge-gripping prealigners (8, 80) grasp a wafer (10) by at least three edge-gripping capstans (12) that are equally spaced around a periphery (13) of the wafer. Each edge-gripping capstan is coupled by a continuous synchronous belt (14) to a drive hub (15, 84) that is rotated by a drive motor (18, 88). The belts are tensioned by idler pulleys (22, 92) that are rotated by a motive force (25, 96, 102). The edge-gripping capstans and the drive drums are mounted to hinged bearing housings (28, 112) that are spring biased to urge the capstans away from the drive hub. Deactivating the motive force rotates the idler plates into a belt tensioning position that draws the capstans inward to grip the periphery of the wafer. Once gripped, rotation of the drive hub is coupled through the tensioned belts to the capstans. Driving all the capstans provides positive grasping and rotation of the wafer without surface contact with the wafer and thereby reduces wafer damage and particle contamination.

46 Claims, 7 Drawing Sheets

EDGE GRIPPING SPECIMEN PREALIGNER

FIELD OF THE INVENTION

This invention is directed to a specimen prealigning apparatus and method and, more particularly, to an edge gripping semiconductor wafer prealigner that substantially reduces wafer backside damage and particulate contamination.

BACKGROUND OF THE INVENTION

Integrated circuits are produced from wafers of semiconductor material. The wafers are typically housed in a cassette having a plurality of closely spaced slots, each of which can contain a wafer. The cassette is typically moved to a processing station where the wafers are removed from the cassette, placed in a predetermined orientation (prealigned), and returned to another location for further wafer processing.

Various types of wafer handling devices are known for transporting the wafers to and from the cassette and among processing stations. Many employ a robotic arm having a spatula-shaped end that is inserted into the cassette to remove or insert a wafer. The end of the robotic arm typically employs vacuum pressure to releasably hold the wafer to the end of the arm. The robotic arm enters the cassette through the narrow gap between an adjacent pair of wafer slots and engages the backside of a wafer to retrieve it from the cassette. After the wafer has been processed, the robotic arm inserts the wafer back into the cassette.

U.S. Pat. No. 5,513,948 for UNIVERSAL SPECIMEN PREALIGNER, which is assigned to the assignee of this application, and U.S. Pat. No. 5,238,354 for SEMICONDUCTOR OBJECT PRE-ALIGNING APPARATUS describe prior semiconductor wafer prealigners that include a rotating vacuum chuck on which the wafer is placed by a robot arm for prealigning.

Unfortunately, transferring the wafer among the cassette, robot arm, and prealigner may cause backside damage thereto and contamination of the other wafers housed in the cassette because engagement with the wafer may dislodge particles that can fall and settle onto the other wafers. Robotic arms and prealigners that employ a vacuum pressure to grip the wafer can be designed to minimize particle creation. Even the few particles created with vacuum pressure gripping or any other non-edge gripping method are sufficient to contaminate adjacent wafers housed in the cassette. Reducing such contamination is particularly important to maintaining wafer processing yields. Moreover, the wafer being transferred may be scratched or abraded on its backside, resulting in wafer processing damage.

What is needed, therefore, is a wafer gripping technique that can securely, quickly, and accurately prealign wafers while minimizing particle contamination and wafer scratching.

SUMMARY OF THE INVENTION

An object of this invention is, therefore, to provide an apparatus and a method for prealigning semiconductor wafers.

Another object of this invention is to provide an apparatus and a method for quickly and accurately prealigning specimens.

A further object of this invention is to provide an apparatus and a method for prealigning wafers while minimizing particle contamination and wafer scratching.

Specimen edge-gripping prealigners of this invention grasp a wafer by at least three edge-gripping capstans that are preferably equally spaced around the periphery of the wafer. Each of the edge-gripping capstans is coupled by a continuous synchronous belt to an axially centered, grooved drive hub that is rotated by a drive motor. Each of the capstans is also coaxially connected to a grooved drive drum that is coupled to the drive hub by one of the continuous synchronous belts, and each belt is routed in a unique location in a set of grooves in the drive drums and the drive hub. The continuous synchronous belts are tensioned by idler pulleys that are mounted to axially rotatable idler plates that are coupled together for common rotation by a belt tensioning motor or some other form of rotary biasing force, such as a spring, solenoid, or vacuum pressure actuated piston.

The edge-gripping capstans and the grooved drive drums are mounted to hinged bearing housings that are pivotally spring biased to preload the grooved drive drums radially away from the axially centered drive hub. The edge-gripping capstans can be driven radially inward to grip the wafer by rotating the belt tensioning motor to apply sufficient tension to overcome the spring preload force on the idler plates. Once gripped, the wafer can be rotated by energizing the drive motor to rotate the drive hub, which rotation is coupled through the tensioned belts and drive drums to the capstans.

The edge-gripping specimen prealigner of this invention is suitable for prealigning semiconductor wafers. Simultaneously rotating all the edge-gripping capstans provides positive rotation of the wafer without wafer surface contact, which eliminates wafer backside damage. Synchronously driving of all the capstans prevents slippage between each capstan and the wafer and thereby results in minimized edge contamination.

Additional objects and advantages of this invention will be apparent from the following detailed description of preferred embodiments thereof that proceed with reference to the accompanying drawings.

DETAILED DESCRIPTION OF PREFERRED EMBODIMENTS

Figure 1:
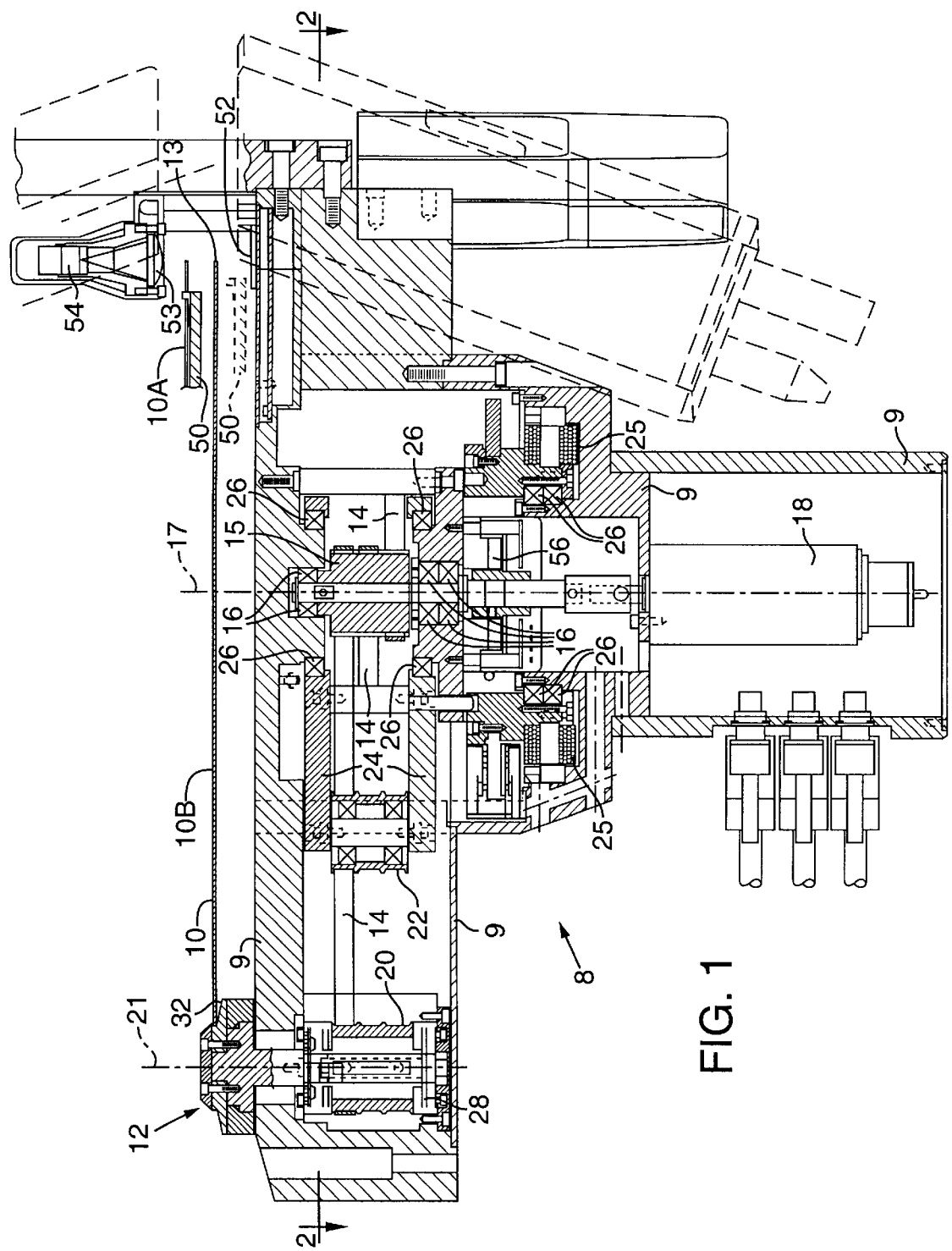
FIG. 1 is a sectional elevation view of a first embodiment of an edge-gripping specimen prealigner of this invention showing internal details of motors, belt drives, capstans, and a specimen peripheral edge scanner.
Figure 2:
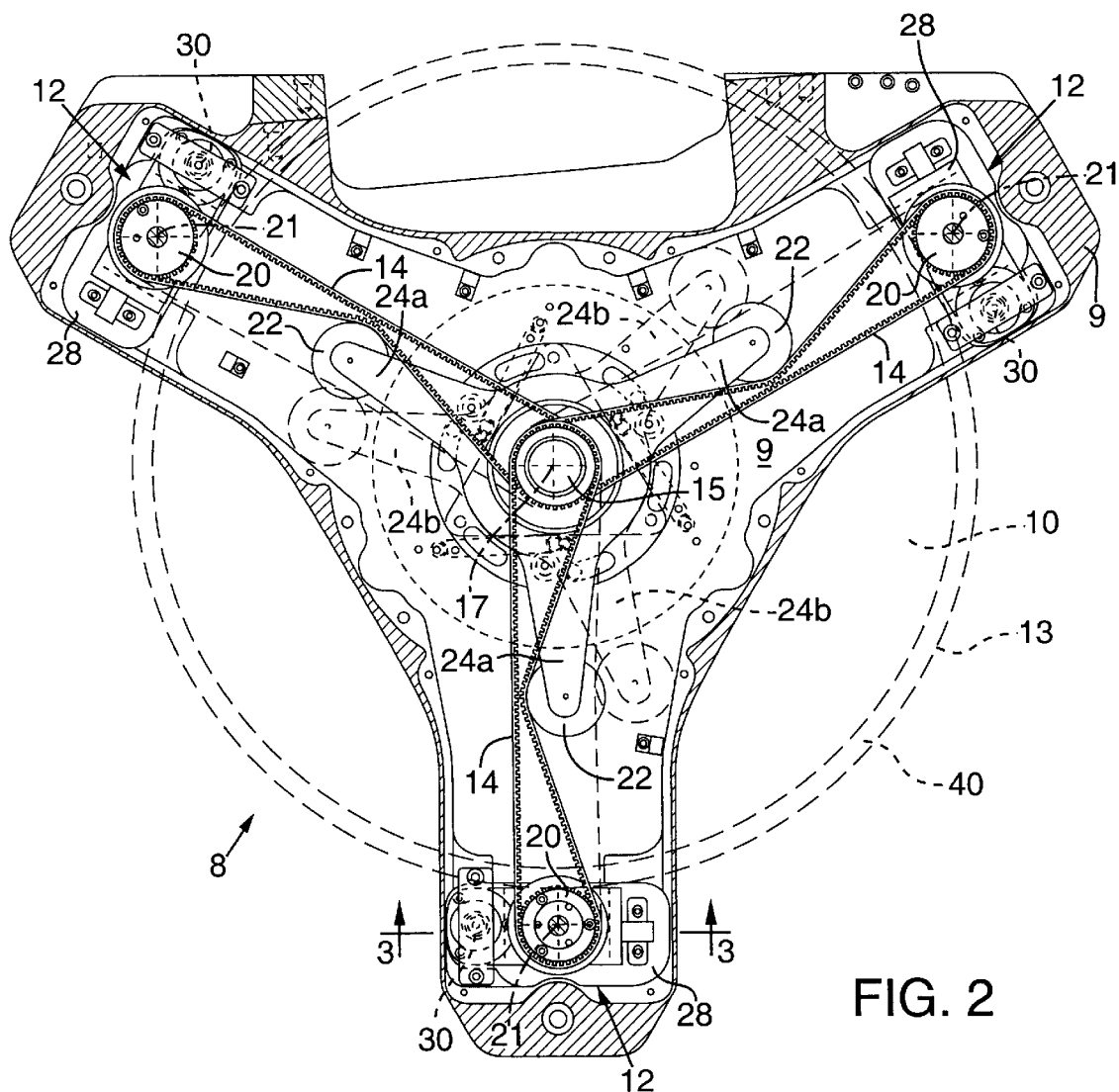
FIG. 2 is a sectional top view taken along lines 2—2 of FIG. 1 showing belt driving and tensioning mechanisms coupling a drive motor to three specimen edge gripping capstans.

FIGS. 1 and 2 show sectional side and bottom views of a first preferred embodiment of a specimen edge-gripping prealigner 8 (hereafter "prealigner 8"). Prealigner 8 is composed of a frame 9 to which three edge-gripping capstans 12 are movably mounted and positioned to grasp a generally circular specimen, such as a wafer 10 (shown in phantom in FIG. 2). The capstans 12 are preferably spaced equally apart and located along a circle generally defined by a periphery 13 (shown in dashed lines in FIG. 2) of wafer 10. Periphery 13 may include "flat" and "notch" features, which are used for orientating wafer 10. Prealigner 8 may be adapted for use with any generally circular specimens.

Edge-gripping capstans 12 are coupled by continuous synchronous belts 14 to a grooved drive hub 15 that is journaled in bearings 16 for rotation about a rotational axis 17 by a motor 18, all of which are supported by frame 9. Edge-gripping capstans 12 are directly coupled to grooved drive drums 20. Each drive drum 20 is coupled to drive hub 15 by a different one of the three continuous synchronous belts 14. Each of belts 14 is routed at a different elevation around the same set of associated grooves in its corresponding drive drum 20 and drive hub 15. The resulting rotation of edge-gripping capstans 12 takes place about capstan axes 21, which extend parallel to rotational axis 17.

Continuous synchronous belts 14 are tensioned by idler pulleys 22 that are mounted to radially extending arms of an axially rotatable idler plate 24, which is shown in FIG. 2 rotated to a belt tensioning position 24A (solid lines) and an alternate belt untensioned position 24B (phantom lines). Idler plate 24 is rotated through a predetermined angular range about rotational axis 17 by a motor 25 or some other rotary biasing force, such as a spring and a solenoid. Motor 25 and idler plate 24 are journaled for rotation about bearings 26, all of which are supported by frame 9.

Figure 3:
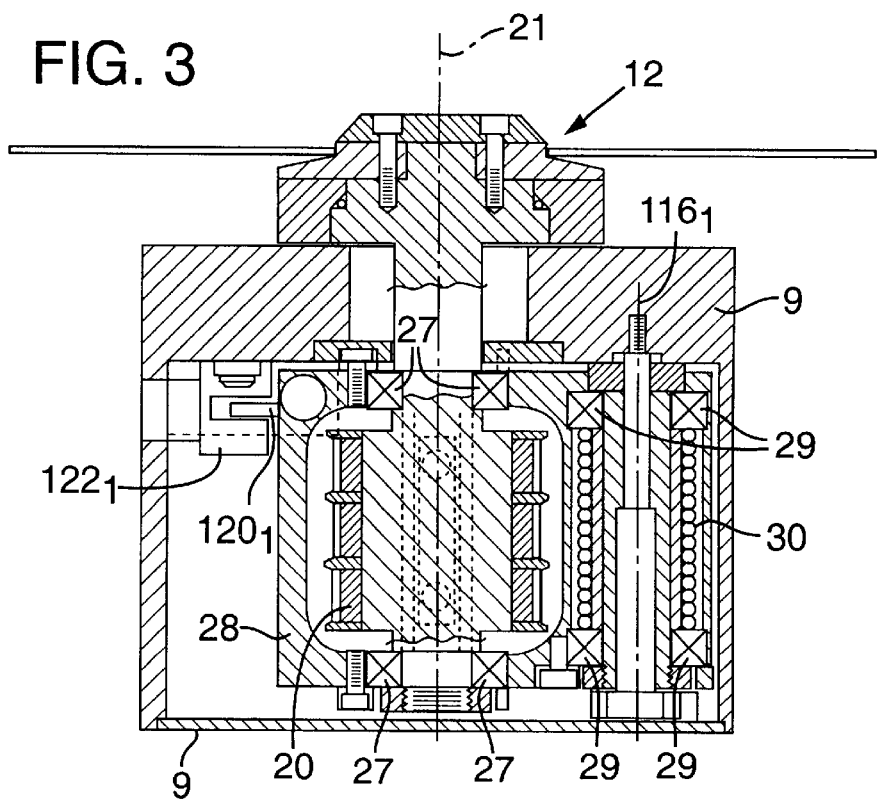
FIG. 3 is a sectional elevation view taken along lines 3—3 of FIG. 2 showing internal details of a representative drive drum and specimen edge gripping capstan of this invention.
Figure 6:
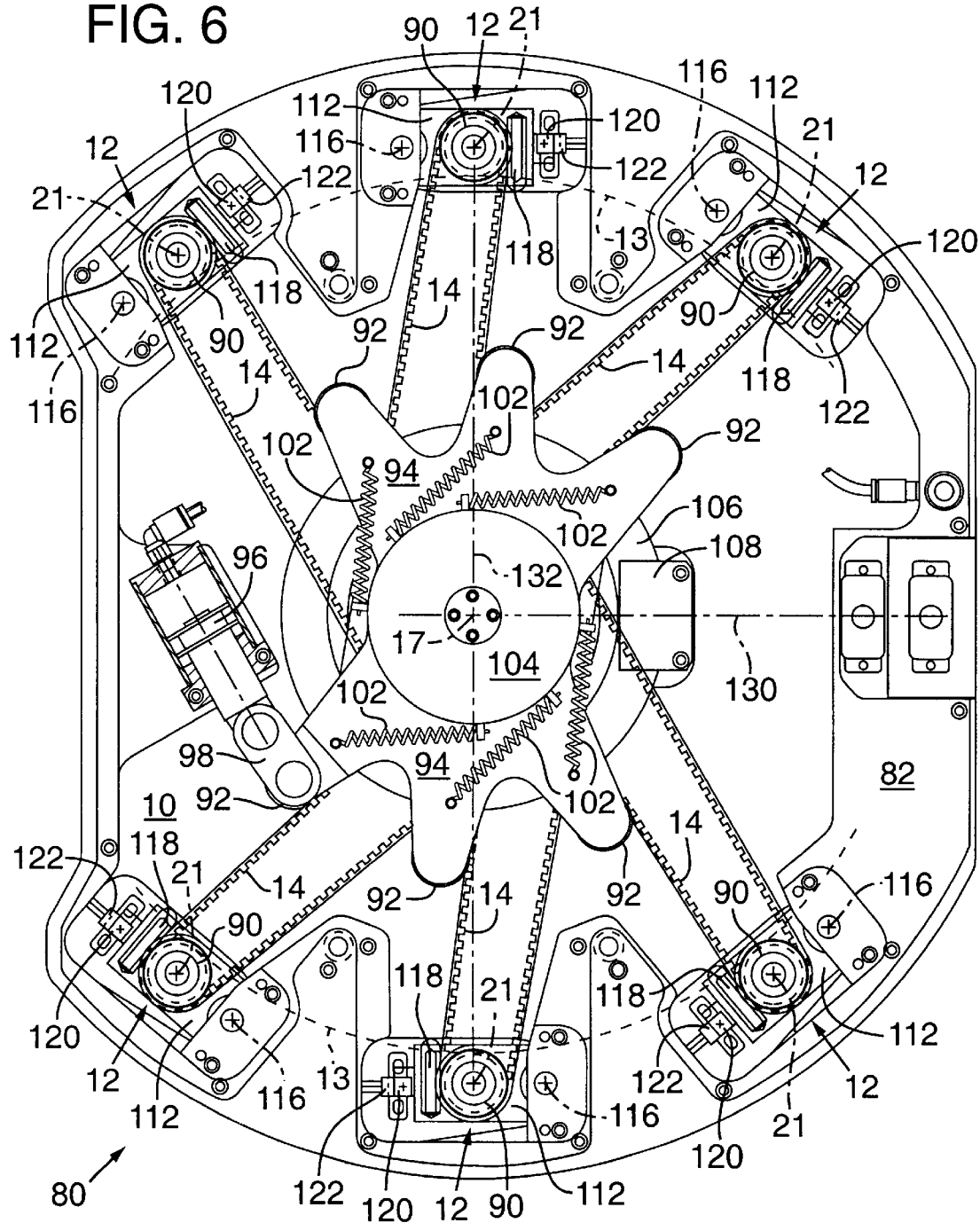
FIG. 6 is a bottom view of FIG. 5 showing belt driving and tensioning mechanisms coupling a drive motor to six specimen edge gripping capstans that are in a specimen edge-gripping position.
Figure 7:
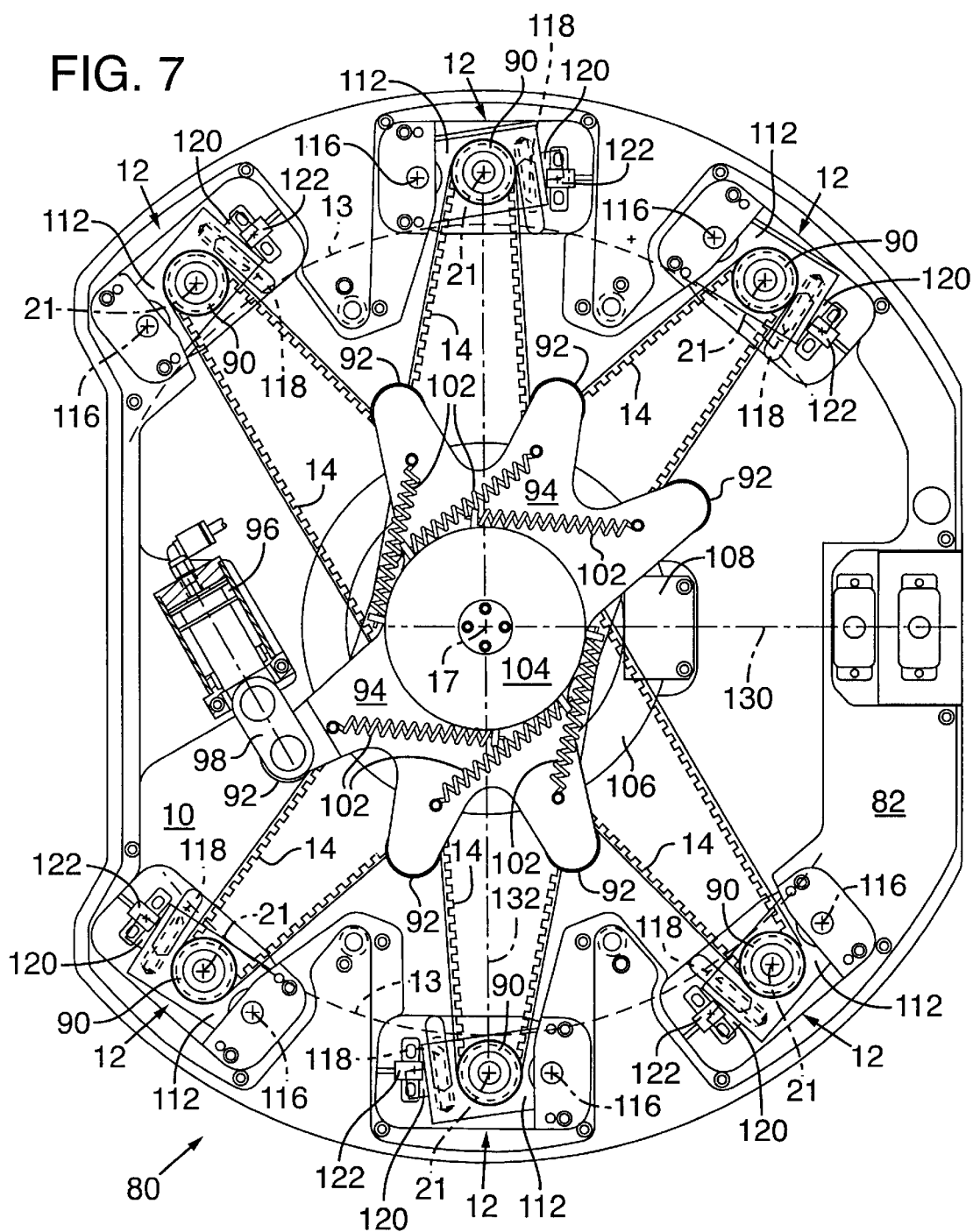
FIG. 7 is a bottom view of FIG. 5 showing belt driving and tensioning mechanisms coupling a drive motor to six specimen edge gripping capstans that are in a specimen releasing position.

Referring to FIG. 3, each of grooved drive drums 20 is journaled for rotation about bearings 27 that are mounted in associated ones of hinged bearing housings 28. Bearing housing 28 are journaled for pivotal movement about bearings 29, which are supported by frame 9. The pivoting of hinged bearing housings 28 allows radial displacement of capstan axis 21 relative to rotational axis 17. The pivoting of hinged bearing housings 112 allows radial displacement of capstan axis 21 relative to rotational axis 17. Each of hinged bearing housings 28 includes a coil spring 30 that preloads drive drum 20 away from rotational axis 17. To ensure proper movement of edge-gripping capstans 12, each of hinged bearing housings 28 further includes a vane 120, that protrudes from the end of hinged bearing housing 28 opposite pivot axis 116,. Depending on the rotational state of hinged bearing housing 112, vane 120, is positioned to alternately interrupt (see FIG. 6 showing this position for an alternative embodiment) or not interrupt (see FIG. 7 showing this position for an alternative embodiment) a light beam within an optical sensor 122,. All three of optical sensors 122, acting together provide a positive electrical indication of whether prealigner 8 is in a wafer gripping state or a wafer releasing state.

Figure 4:
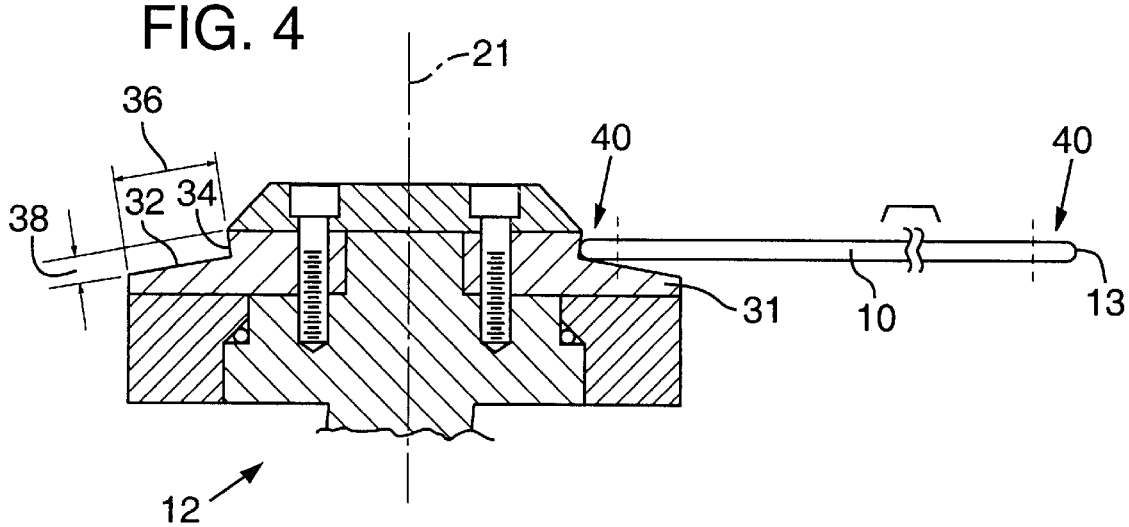
FIG. 4 is an enlarged sectional view of an edge-gripping capstan gripping a wafer periphery in a manner according to this invention.

FIG. 4 shows an enlarged view of a representative one of edge-gripping capstans 12, which includes a wafer-contacting pulley 31 that may be formed from various materials, and preferably polyetheretherketone ("peek"), a semi-crystalline high temperature thermoplastic manufactured by Victrex in the United Kingdom. The material forming wafer-contacting pulley 31 may be changed to suit the working environment, such as in high temperature applications. Peek material provides a contamination resistant low scratching wafer contacting surface.

Wafer-contacting pulley 31 includes a load/unload portion 32 ramped at a shallow angle for supporting wafer 10 when capstan 12 is in its specimen gripping and nongripping positions. Pulley 31 also includes an inwardly inclined ramp-backstop portion 34 that is pressed against the periphery 13 of wafer 10 when capstan 12 is in its specimen gripping position.

Load/unload ramp portion 32 has a radial width 36 that allows adequate range for the wafer positioning variation of the mechanism which loads the wafer onto the prealigner. Load/unload ramp portion 32 is angled downwardly from the plane of wafer 10 by an angle greater than 0 degrees, and preferably 1 to 5 degrees.

Inwardly inclined backstop portion 34 has a height 38 large enough to capture wafer 10, preferably between about 1 mm and 2 mm and is angled upwardly from the plane of wafer 10 to secure it by about 3 degrees.

Load/unload ramp portion 32 and backstop portion 34 together form an intersecting pair of truncated right conical sections having an included angle for gripping periphery 13 of wafer 10.

When edge-gripping capstans 12 are actuated to press against periphery 13 of wafer 10, the intersecting inclined conical surfaces formed by load/unload ramp portion 32 and inwardly inclined backstop portion 34 positively grip and maintain wafer 10 in a preferable horizontal attitude, although other attitudes are possible. When edge-gripping capstans 12 are released from gripping wafer 10, load/unload ramp portion 32 supports the periphery 13 of wafer 10.

A typical operational sequence for prealigner 8 is described below with reference to FIGS. 1 and 2.

Prealigner 8 is in an initial state in which no wafer 10 is present and idler plate 24 is in belt untensioning position 24B.

A robot arm 50 (fragmentary view shown in FIG. 1) grips wafer 10 by periphery 13 and positions wafer 10 at a wafer position 10A that is separated apart from but substantially parallel to a plane passing through load/unload ramp portions 32 of edge-gripping capstans 12. Robot arm 50 performs wafer 10 positioning movements in one of the approximately 120-degree clearance spaces between edge-gripping capstans 12. A specimen edge-gripping robot arm suitable for use with this invention is described in copending U.S. Pat. application Ser. No. 09/204,747, filed Dec. 2, 1998, for ROBOT ARM WITH SPECIMEN EDGE GRIPPING END EFFECTOR, which is assigned to the assignee of this application.

Robot arm 50 lowers wafer 10 to a wafer position 10B such that wafer 10 is supported by the load/unload ramp portions 32 of edge-gripping capstans 12.

Robot arm 50 disengages from wafer 10 and moves to a wafer disengaged position (shown in dashed lines). Robot arm 50 may stay at the wafer disengaged position during subsequent wafer prealigning operations or it may be withdrawn from prealigner 8.

Motor 25 is actuated to rotate idler plate 24 from untensioned position 24B to tensioned position 24A to provide sufficient tension in belts 14 to overcome the preload force applied to grooved drive drums 20 and to draw edge-gripping capstans 12 radially inward to grip periphery 13 of wafer 10.

Once gripped, wafer 10 is rotated by energizing motor 18 to rotate drive hub 15, which rotation is coupled through tensioned belts 14 and drive drums 20 and, therefore, to edge-gripping capstans 12. Preferably all of edge-gripping capstans 12 are driven to prevent rotational slippage, even though wafer 10 is gripped with minimal force.

During rotation of wafer 10, a linear charge-coupled device ("CCD") array 52 receives an image of a slice of periphery 13 of wafer 10. Periphery 13 is illuminated through a collimating lens 53 by a light source 54 that casts a shadow of the periphery 13 on CCD array 52. The "terminator" position of the shadow on individual sensors in the CCD array 52 provides a signal from CCD array 52 that accurately represents a radial distance between rotational axis 17 and periphery 13 for each of a set of rotational angles of wafer 10. CCD array 52 may also sense when wafer 10 is gripped by detecting a lateral movement of periphery 13.

An optical rotary encoder 56 provides feedback to control the rotation of motor 25. A notch (not shown) in periphery 13 serves as an angular index mark for determining in cooperation with optical rotary encoder 56 the actual rotational angles of wafer 10 since there is uncertainty of the actual effective radii of the wafer 10 and the edge-gripping capstans 12.

Prealigning of wafer 10 may be carried out in the manner described in the above-referenced U.S. Pat. No. 5,513,948 for UNIVERSAL SPECIMEN PREALIGNER.

After wafer 10 is prealigned, motor 18 is deactivated, motor 25 rotates idler plate 24 to belt untensioning position 24B, and robot arm 50 retrieves wafer 10 from prealigner 8.

Figure 5:
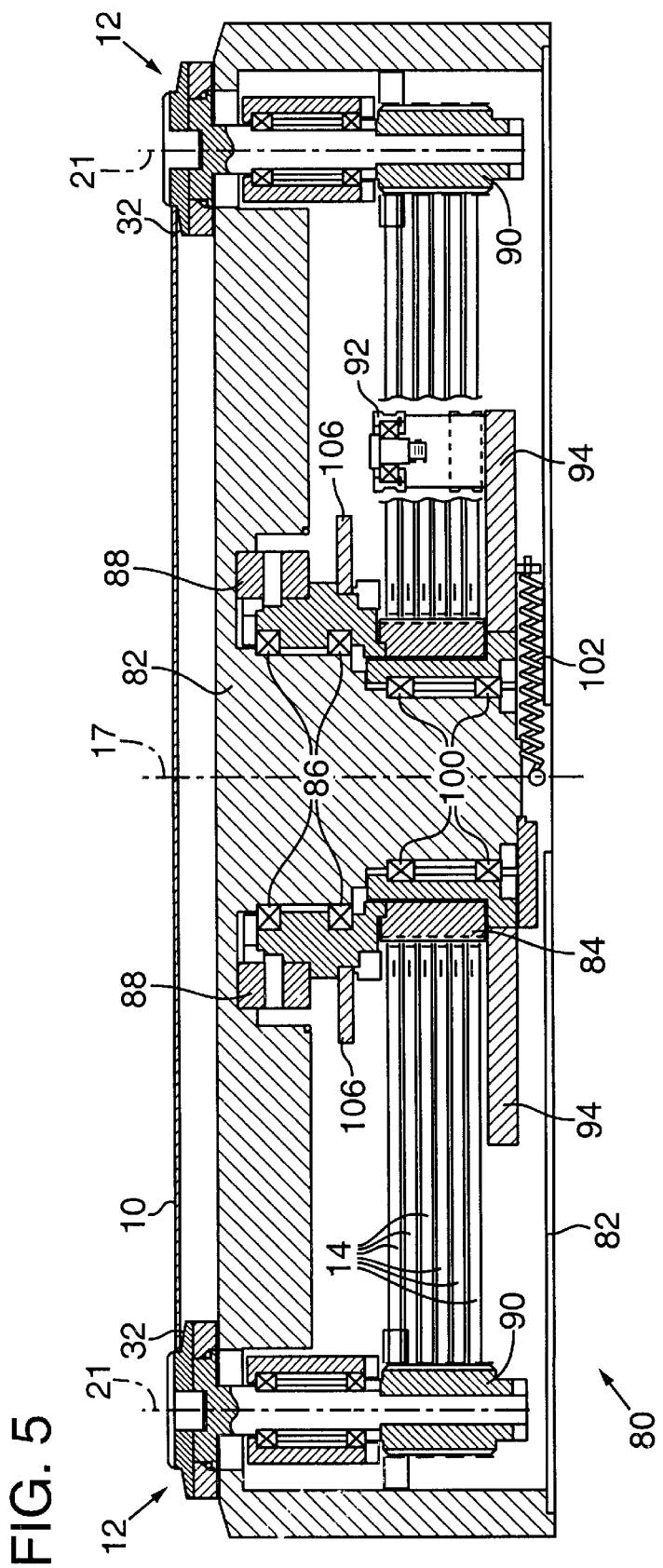
FIG. 5 is a sectional elevation view of a second embodiment of an edge-gripping specimen prealigner of this invention showing internal details of motors, belt drives, and capstans.

FIGS. 5, 6, and 7 show respectively a sectional side view and two bottom views of a second preferred embodiment of a specimen edge-gripping prealigner 80 (hereafter "prealigner 80"). Prealigner 80 is composed of a frame 82 to which six edge-gripping capstans 12 are movably mounted and positioned to grasp a generally circular specimen, such as wafer 10 (shown in phantom in FIGS. 6 and 7). The capstans are spaced apart and located along a circular plane generally defined by a periphery 13 (shown in dashed lines in FIGS. 6 and 7) of wafer 10. Periphery 13 typically includes a "notch" feature for identifying a rotational index orientation for wafer 10. FIGS. 6 and 7 show periphery 13 of wafer 10 respectively gripped and released by edge-gripping capstans 12.

Prealigner 80 may be adapted for use with generally circular specimens, such as wafer 10 having a nominal diameter ranging from about 200 mm to 300 mm, although other diameters would also be applicable.

Edge-gripping capstans 12 are coupled by continuous synchronous belts 14 to a drive hub 84 that is journaled in bearings 86 for rotation about rotational axis 17 by a motor 88, all of which are supported by frame 82. Edge-gripping capstans 12 are directly coupled to drive drums 90. Each drive drum 90 is coupled to drive hub 84 by a different one of the six continuous synchronous belts 14. Each of belts 14 is routed at different elevations around the same set of associated grooves in its corresponding drive drum 90 and drive hub 84. The resulting rotation of edge-gripping capstans 12 takes place about capstan axes 21, which extend parallel to rotational axis 17.

Continuous synchronous belts 14 are tensioned by idler pulleys 92 that are mounted at the ends of arms that extend radially from an axially rotatable idler plate 94, which is shown in FIG. 6 rotated to a belt tensioning position and in FIG. 7 rotated to a belt untensioned position. Idler plate 94 is rotated through an angular range about rotational axis 17 by a vacuum pressure actuated piston 96 acting through a coupling link 98 that is attached to the end of one of the arms of idler plate 94. Idler plate 94 is journaled in bearings 100 for rotation about rotational axis 17.

When vacuum pressure actuated piston 96 receives no vacuum pressure and/or prealigner 80 is deenergized, a set of springs 102 extending between a rotationally adjustable hub 104 and the arms of idler plate 94 provides a biasing force that rotates idler plate 94 to the belt tensioning position shown in FIG. 6. This is advantageous because prealigner 80 will remain in a wafer gripping state in the event of a power or vacuum pressure failure. The amount of biasing force is adjustable by rotating adjustable hub 104. While a single spring 102 could provide the biasing force, multiple springs are preferred because they provide a more uniform and linear biasing force to idler plate 94. Of course, when moving idler plate 94 to the belt relaxing position shown in FIG. 7, vacuum pressure actuated piston 96 must provide sufficient force to overcome the biasing force of springs 102.

Drive hub 84 and drive drums 90 have unequal diameters that provide about a 3.6:1 drive ratio from drive hub 84 to drive drums 90 in a preferred embodiment. The rotational position of drive hub 84 is sensed by a conventional glass scale rotary encoder 106 and an associated optical sensor 108.

Figure 8:
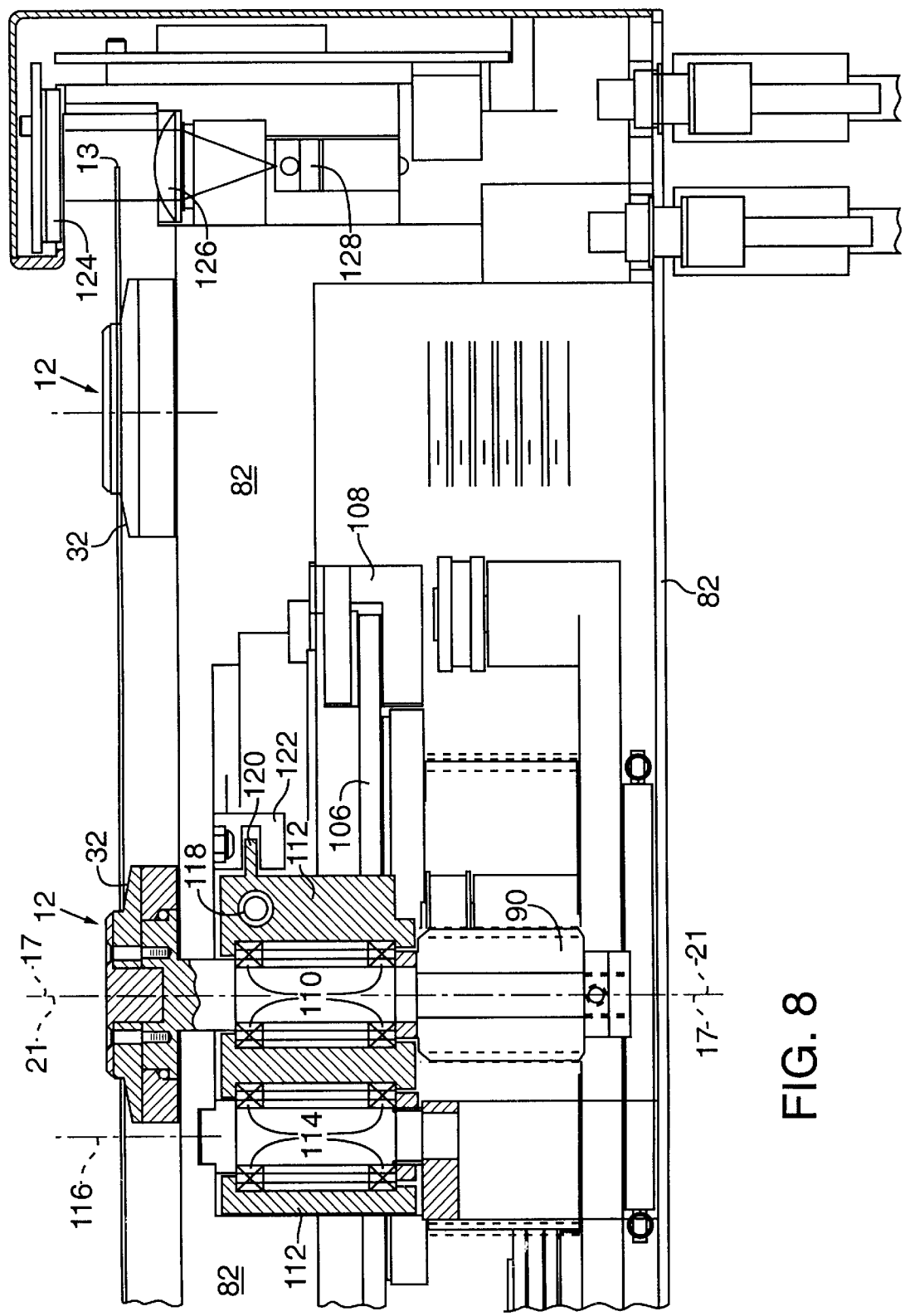
FIG. 8 is an enlarged sectional elevation view showing internal details of a representative drive drum, specimen edge gripping capstan, and specimen peripheral edge scanner of this invention.

Referring also to FIG. 8, each drive drum 90 is journaled on bearings 110 that are mounted in associated ones of hinged bearing housings 112. The hinged bearing housings 122 are journaled on bearings 114 for pivoting about a pivot axis 116. The pivoting of hinged bearing housings 112 allows radial displacement of capstan axis 21 relative to rotational axis 17. Each of hinged bearing housings 112 further includes a coil spring 118 that preloads drive drum 90 radially away from rotational axis 17.

The preloading force provided by springs 118 is sufficient to move edge-gripping capstans 12 radially away from rotational axis 17 when belts 14 are in the untensioned state, but the preloading force is insufficient when belts 14 are in the tensioned state. Accordingly, edge-gripping capstans 12 alternate between wafer gripping and wafer releasing positions in response to actuation of vacuum pressure actuated piston 96. To ensure proper movement of edge-gripping capstans 12, each of hinged bearing housings 112 further includes a vane 120 that protrudes from the end of hinged bearing housing 112 opposite pivot axis 116. Depending on the rotational state of hinged bearing housing 112, vane 120 is positioned to alternately interrupt (FIG. 6) or not interrupt (FIG. 7) a light beam within an optical sensor 122. All six of optical sensors 122 acting together provide a positive electrical indication of whether prealigner 80 is in a wafer gripping state or a wafer releasing state.

A typical operational sequence for prealigner 80 is described below with reference to FIGS. 5, 6, 7, and 8.

Prealigner 80 is in an initial state in which no wafer 10 is present and idler plate 94 is in the belt untensioning position shown in FIG. 7.

A robot arm (not shown) grips wafer 10 by periphery 13 and positions wafer 10 similar to the manner described above for prealigner 8.

The robot arm lowers wafer 10 such that wafer 10 rests on load/unload ramp portions 32 of edge-gripping capstans 12.

The robot arm disengages from wafer 10 and moves to a wafer disengaged position. The robot arm may stay at the wafer disengaged position during subsequent wafer prealigning operations or it may be withdrawn from prealigner 80.

Vacuum pressure actuated piston 96 is deactuated to rotate idler plate 94 from the belt untensioned position shown in FIG. 7 to the belt tensioned position shown in FIG. 6, thereby drawing edge-gripping capstans 12 radially inward to grip periphery 13 of wafer 10.

Once gripped, wafer 10 is rotated by energizing motor 88 to rotate drive hub 84, which rotation is coupled through tensioned belts 14 and drive drum 90 and, therefore, to edge-gripping capstans 12. Preferably all of edge-gripping capstans 12 are driven to prevent rotational slippage, even though wafer 10 is gripped with minimal force.

During rotation of wafer 10, a linear charge-coupled device ("CCD") array 124 receives an image of a slice of periphery 13 of wafer 10. Periphery 13 is illuminated through a collimating lens 126 by a light source 128 that casts a shadow of the periphery 13 on CCD array 124. The "terminator" position of the shadow on individual sensors in the CCD array 124 provides a signal from CCD array 124 that accurately represents a radial distance between rotational axis 17 and periphery 13 for each of a set of rotational angles of wafer 10. CCD array 124 may also sense when wafer 10 is gripped by detecting a lateral movement of periphery 13.

Rotational axis 17 is substantially coaxial with the effective center of wafer 10 because of the angular spacing of edge-gripping capstans 12 around periphery 13. Edge-gripping capstans 12 are arranged in two groups of three, with the groups on opposite sides of a first imaginary line 130 extending through rotational axis 17 and CCD array 124. Adjacent capstans 12 in each group are angularly spaced apart from each other, with the center capstan in each group having its capstan axis 21 lying in a second imaginary line 132 that extends perpendicular to the first imaginary line 130 and through rotational axis 17.

The amount of angular rotation imparted by edge-gripping capstans 12 to wafer 10 is sensed by rotary encoder 106 and optical sensor 108 that is coupled to drive hub 84. A notch (not shown) in periphery 13 serves as an angular index mark for determining in cooperation with rotary encoder 106 and optical sensor 108 the actual rotational angles of wafer 10. Because the diameter of wafer 10 is a variable and wafer periphery 13 may be square, chamfered, or rounded, an angular encoding calibration is carried out as follows. Wafer 10 is rotated until CCD array 124 senses the notch. Wafer 10 is rotated one complete revolution until CCD array 124 again senses the notch. During one complete notch-to-notch revolution of wafer 10, the distance travelled is measured by the optical sensor 108. The total distance measured is divided by one revolution in the appropriate unit system to derive the appropriate relationship between the distance units of optical sensor 108 and wafer rotational units. During a subsequent notch-to-notch rotation of wafer 10, a set of radius measurements made at predetermined angular intervals by CCD array 124 sensing periphery 13 of wafer 10 as described above.

Thereafter, rotational prealigning of wafer 10 may be carried out in the manner described in the above-referenced U.S. Pat. No. 5,513,948.

After wafer 10 is prealigned, vacuum pressure actuated piston 96 is activated to rotate idler plate 94 to belt untensioned position shown in FIG. 7, and the robot arm retrieves wafer 10 from prealigner 80.

Skilled workers will recognize that portions of this invention may be implemented differently from the implementations described above for preferred embodiments. For example, different drive hub to capstan ratios may be employed. Three and six capstan embodiments are shown, but many embodiments with more than three capstans are envisioned can be implemented. Also, the capstans necessarily require neither equal angular spacing around the specimen nor the spacings shown and described in the above-described embodiments.

It will be obvious to those having skill in the art that many changes may be made to the details of the above-described embodiments of this invention without departing from the underlying principles thereof. Accordingly, it will be appreciated that this invention is also applicable to specimen handling applications other than those found in semiconductor wafer processing. The scope of the present invention should, therefore, be determined only by the following claims.

We claim:

1. An apparatus for rotating a substantially planar, generally circular specimen having an effective center and a major surface with a periphery, the major surface including a work area and an exclusion zone extending outwardly of the work area to the periphery, comprising:

a frame, multiple capstans mounted to the frame to support the specimen and rotate about different capstan axes relative to the frame, the multiple capstans mutually spaced apart at locations to receive and support the specimen by contact outwardly of the work area, and each of the capstans having a specimen receiving surface that when in contact with the specimen grips the specimen as the capstan rotates about its capstan axis;

a drive mechanism that is common to all of the multiple capstans and includes a motor and a linkage mechanism, the motor imparting rotational motion to a shaft, and the linkage mechanism operatively coupled to the shaft and each of the multiple capstans to drive them in synchronous rotation about their respective capstan axes and thereby rotate the specimen without slippage between each of the multiple capstans and the specimen as it rotates through actual rotational angles;

a rotary position detector operatively coupled to the shaft to track its rotational position; and a specimen peripheral edge sensing device operatively associated with the specimen to sense and provide a reference signal indicative of a reference location of the specimen as it rotates about its effective center, the rotary position detector operatively linked with the edge sensing device to respond to the reference signal to synchronize tracking of the rotation of the specimen and the rotation of the shaft and thereby provide an indication of the actual rotational angles of the specimen.

2. The apparatus of claim 1, in which the linkage mechanism includes multiple continuous belts and in which each one of the capstans is operatively connected to one of the continuous belts.

3. The apparatus of claim 2, further including multiple idler pulleys each of which is associated with one of the continuous belts, the idler pulleys being movable to place the continuous belts in alternate tensioned and untensioned states, the tensioned state drawing the capstans inwardly toward the specimen to grip it and the untensioned state drawing the capstans away from the specimen to release it.

4. The apparatus of claim 3, further including an idler plate to which each idler pulley is mounted, the idler plate being movable to tension and untension the belts.

5. The apparatus of claim 4, in which the idler plate is moved by a spring or a solenoid.

6. The apparatus of claim 4, in which the idler plate is urged by a spring to place the continuous belts in the tensioned state and is moved against the spring by a fluid motor to place the continuous belts in the untensioned state.

7. The apparatus of claim 1, in which each continuous belt is coupled to the drive mechanism to rotate the capstans in unison.

8. The apparatus of claim 2 in which each one of the capstans is operatively connected to its associated continuous belt by a drive drum directly coupled to the associated capstan, the drive drum mounted for rotation in a housing pivotally mounted to the frame.

9. The apparatus of claim 8, in which each drive drum is journaled for rotation about the associated capstan axis.

10. The apparatus of claim 8, in which each housing is pivotally mounted to the frame about an axis spaced from its associated capstan axis and includes a spring to urge the housing and thereby its associated capstan away from the specimen.

11. The apparatus of claim 1, in which the specimen is a semiconductor wafer.

12. The apparatus of claim 11, in which the semiconductor wafer has a diameter ranging from between about 200 mm to about 300 mm.

13. The apparatus of claim 1, in which each capstan has a load/unload ramp extending radially away from the capstan axis and downward relative to the plane of the specimen and a backstop portion that extends radially away from the capstan axis and upward relative to the plane of the specimen, the ramp portion and backstop portion forming an intersecting pair of truncated right conical sections having an included angle for gripping the specimen.

14. The apparatus of claim 13, in which the ramp portion extends downward by an angle ranging from between about 0 degrees to about 5 degrees relative to the plane of the specimen.

15. The apparatus of claims 13, in which the backstop extends upward by an angle of about 87 degrees relative to the plane of the specimen.

16. The apparatus of claim 1, further including an optical sensor within which a light beam propagates and a protrusion, the optical sensor and the protrusion located on different ones of the frame and the housing, and the housing movable to alternately interrupt and not interrupt the light beam propagating within the optical sensor to indicate a wafer gripping state and a wafer releasing state.

17. The apparatus of claim 1, in which:
the shaft rotates about a drive axis;
the specimen peripheral edge sensing device includes an illumination source and a charged-coupled device array; and
the illumination source illuminates the specimen to create an image of the specimen on the charged-coupled device array to indicate a radial distance between the drive axis and the periphery for each of a set of rotational angles of the specimen and to detect a lateral movement of the specimen.

18. The apparatus of claim 17, further including an optical rotary encoder that provides feedback to the motor to determine in cooperation with the specimen the actual rotation angles.

19. Apparatus for rotating a substantially planar, generally circular specimen having a size, an effective center, and a peripheral edge, comprising:

a frame;
multiple capstans each of which including a capstan housing and a specimen edge-gripping surface that is rotatable about a capstan axis, the specimen edge-gripping surfaces mounted for rotation about their respective capstan axes in corresponding ones of the multiple capstan housings mounted to the frame, the multiple capstan housings positioned at mutually spaced-apart locations that allow the specimen edge-gripping surfaces with their respective capstan axes set in edge-nongripping positions to receive and support the specimen at its peripheral edge;
two or more positioning mechanisms operatively coupled to corresponding ones of the specimen edge-gripping surfaces for selective, releasible displacements of their respective capstan axes relative to the frame, the positioning mechanisms imparting to their respective capstan axes selective displacements including radial components relative to the effective center of the specimen, the selective displacements causing the size of the specimen supported by the multiple capstans to establish specimen edge-gripping positions of the capstan axes; and
a drive mechanism operable about a drive axis generally centrally located from and common to all of the multiple capstans and including a linkage mechanism, the linkage mechanism operatively coupled to each of the multiple capstans to drive them in synchronous rotation and thereby rotate the specimen edge-gripping surfaces about their respective capstan axes, the rotation of the specimen edge-gripping surfaces with the capstan axes in their specimen edge-gripping positions imparting to the specimen motive and radial forces that, respectively, rotate the specimen and provide for the specimen sufficient traction on the specimen edge-gripping surfaces to prevent slippage between each of the multiple capstans gripping the specimen and the specimen as it rotates.

20. The apparatus of claim 19, in which each housing is urged away from the specimen by a spring.

21. The apparatus of claim 19, in which each positioning mechanism includes a housing to which a capstan is mounted through a rotatable drive drum coupled to the linkage mechanism, the housing being pivotally mounted to the frame to pivotally move about an axis spaced from the capstan axis.

22. The apparatus of claim 19, further including an optical sensor within which a light beam propagates and a protrusion, the optical sensor and the protrusion located on different ones of the frame and the housing, and the housing movable to alternately interrupt and not interrupt the light beam propagating within the optical sensor to indicate a wafer gripping state and a wafer releasing state.

23. The apparatus of claim 22, further including:
a rotary position detector operatively coupled to the drive mechanism to track its position about the drive axis;
a specimen peripheral edge sensing device operatively associated with the specimen to sense and provide a reference signal indicative of a reference location of the specimen as it rotates about its effective center; and
the rotary position detector operatively linked with the edge sensing device to respond to the reference signal to synchronize tracking of the rotation of the specimen and the rotation of the drive mechanism and thereby provide an indication of the actual rotational angles of the specimen.

24. The apparatus of claim 23, in which the edge sensing device includes an illumination source and a charged-coupled device array, and in which the illumination source illuminates the specimen to create an image of the specimen on the charged-coupled device array to indicate a radial distance between the drive axis and the peripheral edge for each of a set of rotational angles of the specimen and to detect a lateral movement of the specimen.

25. The apparatus of claim 24, further including an optical rotary encoder that provides feedback to the drive mechanism to determine in cooperation with the specimen the actual rotation angles.

26. The apparatus of claim 19, in which each positioning mechanism is selectively moved by the linkage mechanism.

27. The apparatus of claim 19, in which the linkage mechanism includes multiple continuous belts and in which each one of the capstans is operatively connected to one of the continuous belts.

28. The apparatus of claims 19, in which each capstan has a load/unload ramp extending radially away from the capstan axis and downward relative to the plane of the specimen and a backstop portion that extends radially away from the capstan axis and upward relative to the plane of the specimen, the ramp portion and backstop portion forming an intersecting pair of truncated right conical sections having an included angle for gripping the specimen.

29. The apparatus of claim 27, which each positioning mechanism includes a drive drum mounted for rotation within a housing pivotally mounted to the frame.

30. The apparatus of claim 19, in which the drive mechanism includes a rotary motor to rotate the capstans about their respective axes through the linkage mechanism.

31. The apparatus of claim 19, further including multiple idler pulleys each of which is associated with one of the continuous belts, the idler pulleys being movable to place the continuous belts in alternate tensioned and untensioned states, the tensioned state drawing the capstans inwardly toward the specimen to grip it and the untensioned state drawing the capstans away from the specimen to release it.

32. The apparatus of claim 31, further including an idler plate to which each idler pulley is mounted, the idler plate being movable to tension and untension the belts.

33. The apparatus of claim 32, in which the idler plate is moved by a spring or solenoid.

34. The apparatus of claim 32, in which the idler plate is urged by a spring to place the continuous belts in the tensioned state and is moved against the spring by a fluid motor to place the continuous belts in the untensioned state.

35. Apparatus for rotating a substantially planar, generally circular specimen having an effective center, opposed major surfaces, and a peripheral edge, comprising:

a frame;

multiple capstans each of which including a capstan housing and a specimen edge-gripping surface, the multiple capstans mounted for rotation about respective capstan axes in corresponding ones of the capstan housings mounted to the frame at mutually spaced-apart locations that allow the specimen edge-gripping surfaces of the multiple capstans to receive and support the specimen at its peripheral edge, the capstan axes defining corresponding reference datums for the specimen edge-gripping surfaces of the capstans, and each of the specimen edge-gripping surfaces including a ramp portion and a backstop portion joined to form an included angle between them, the backstop portion angularly inclined in a rotational sense relative to its corresponding reference datum such that the ramp portion and backstop portion confront each other and different ones of the opposed major surfaces of the specimen as the specimen edge-gripping surfaces support the specimen by positioning of its peripheral edge into the included angles formed in the specimen edge-gripping surfaces of the capstans; and a drive mechanism operatively coupled to the multiple capstans to rotate them about their respective capstan axes and thereby rotate the specimen about its effective center.

36. The apparatus of claim 35 further including an optical sensor within which a light beam propagates and a protrusion, the optical sensor and the protrusion located on different ones of the frame and the housing, and the housing movable to alternately interrupt and not interrupt the light beam propagating within the optical sensor to indicate a wafer gripping state and a wafer releasing state.

37. The apparatus of claim 35, further including a linkage mechanism for operably coupling the drive mechanism to the multiple capstans to rotate them about their respective capstan axes and thereby rotate the specimen about its effective center.

38. The apparatus of claim 37 in which the linkage mechanism includes multiple continuous belts and in which each one of the capstans is operatively connected to one of the continuous belts.

39. The apparatus of claim 38, in which each one of the capstans is operatively connected to its associated continuous belt by a drive drum directly coupled to the associated capstan, the drive drum mounted for rotation in a housing pivotally mounted to the frame.

40. The apparatus of claim 39, wherein each housing is pivotally mounted to the frame about an axis spaced from its associated capstan axis and includes a spring to urge the housing and thereby its associated capstan away from the specimen.

41. The apparatus of claim 38, further including multiple idler pulleys each of which is associated with one of the continuous belts, the idler pulleys being movable to place the continuous belts in alternate tensioned and untensioned states, the tensioned state drawing the capstans inwardly toward the specimen to grip it and the untensioned state drawing the capstans away from the specimen to release it.

42. The apparatus of claim 41, further including an idler plate to which each idler pulley is mounted, the idler plate being movable to tension and untension the belts.

43. The apparatus of claim 42 in which the idler plate is urged by a spring to place the continuous belts in the tensioned state and is moved against the spring by a fluid motor to place the continuous belts in the untensioned state.

44. The apparatus of claim 42, in which the idler plate is movable by a spring or solenoid.

45. The apparatus of claim 35, in which the ramp portion extends downward by an angle ranging from between about 0 degrees to about 5 degrees relative to the plane of the specimen.

46. The apparatus of claim 45, in which the backstop extends upward by an angle of about 87 degrees relative to the plane of the specimen.

* * * * *